Dec. 6, 1966 J. F. BELL 3,290,604
VHF-UHF TELEVISION TUNER
Filed June 14, 1963 2 Sheets-Sheet 1
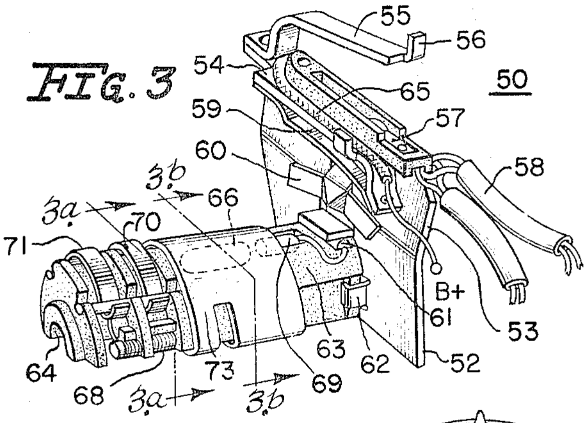
FIG. 3
FIG. 3a
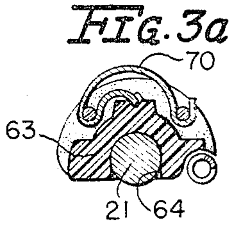
FIG. 3b
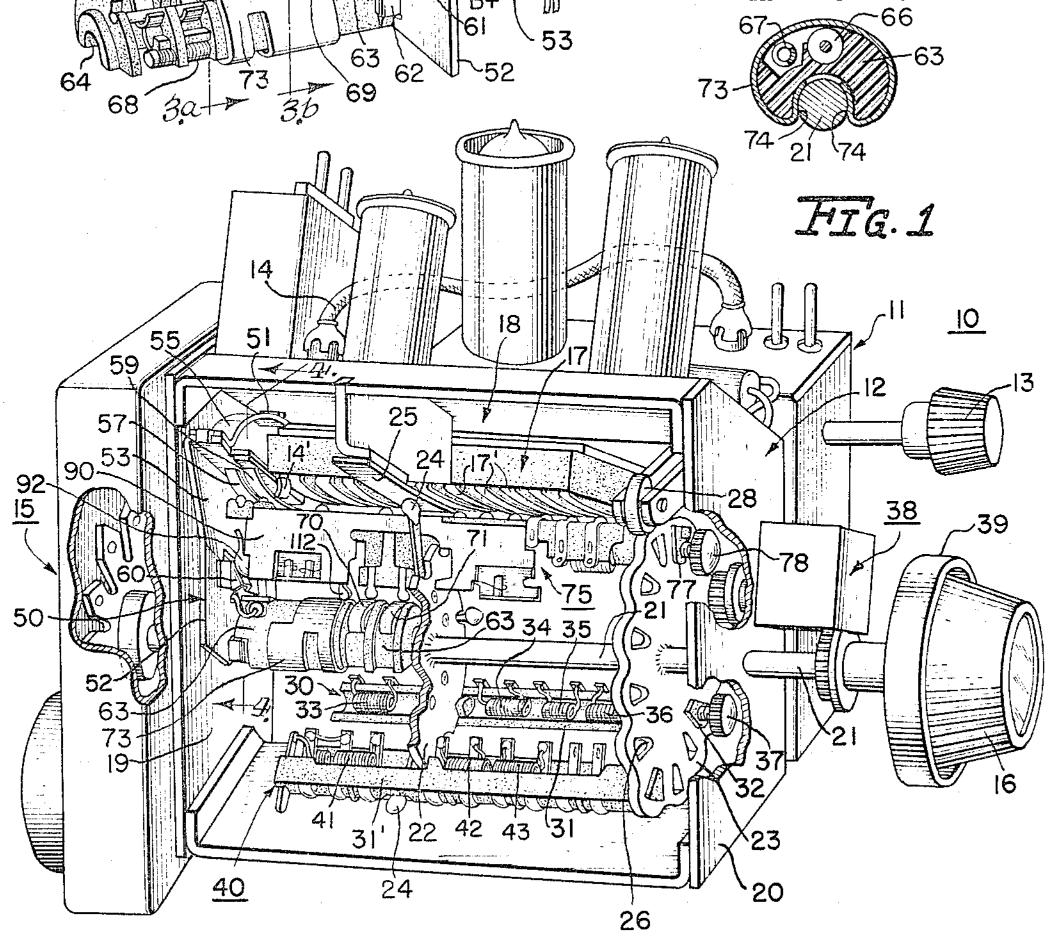
FIG. 1, FIG. 3b
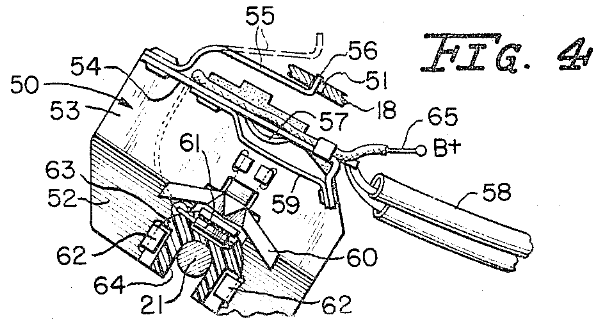
FIG. 4
INVENTOR.
John F. Bell
BY
Cornelius J. O'Connor
Atty.

VHF-UHF TELEVISION TUNER

Filed June 14, 1963 2 Sheets-Sheet 2

INVENTOR.
John F. Bell
BY
Cornelius J. O'Connor
Atty.

United States Patent Office 3,290,604
Patented Dec. 6, 1966

3,290,604

VHF-UHF TELEVISION TUNER

John F. Bell, Wilmette, Ill., assignor to Zenith Radio Corporation, Chicago, Ill., a corporation of Delaware Filed June 14, 1963, Ser. No. 287,922
12 Claims. (Cl. 325—459)

This invention is directed in general to tuner devices and in particular to an improved UHF tuning apparatus for use with a VHF televison tuner.

Initially, television broadcasting was assigned to twelve channels (channels 2–13) in portions of the VHF spectrum extending from approximately 54 megacycles to 216 megacycles. Subsequently, seventy additional channels (channels 14–83) were authorized in that portion of the UHF spectrum extending from 470 megacycles to 890 megacycles. Accordingly, and consonant with an order by the Federal Communications Commission intended to relieve VHF spectrum crowding and stimulate growth of the broadcasting industry, all domestic television receivers will, in the near future, employ a tuning arrangement capable of receiving any of the 70 UHF stations, as well as the 12 VHF stations. This order can readily be complied with by simply providing each receiver with a separate continuous-type UHF tuner in addition to the VHF tuner. However, there is at least one function to which this rather straight-froward expedient does not readily lend itself; a system employing a continuous-type tuner is not readily amenable to remote control. A system of the type contemplated for remotely selecting a desired television channel is described in Patent 2,817,-025 which issued to Robert Adler on December 17, 1957, and which is assigned to the same assignee as the present invention. Because of its relative simplicity and modest cost this system has met with widespread acceptance and trendous commercial success.

Briefly, the referenced remote control system is responsive to an ultrasonic signal which is mechanically generated by a hammer and rod mechanism. This signal is detected by a microphone, amplified and applied to the control circuitry of an electric motor which is mechanically connected to the control shaft of the televison tuner. In this fashion, actuation of an ultrasonic transmitter effects a step-by-step rotation of the tuner to the desired television channel.

Manifestly, a turret-type tuner is most readily adaptable to a remote control function since it is a discrete step tuning device, that is, it comprises a plurality of tuning strips independent of each other and individually tuned to an assigned television channel. Since it would be impracticable to provide an 82 position turret (70 UHF plus 12 VHF strips) to achieve discrete frequency selection in both bands, it is more expedient to employ a conventional VHF turret and replace unused VHF strips with tuning strips for local UHF channels. A particularly attractive UHF tuning system for this purpose is taught by John Bell et al. in Patent 2,596,117 which issued on may 13, 1952, and is also assigned to the same assignee as this invention. Bell et al. disclose a demountable tuning strip comprising preselector and mixer stages for converting a selected UHF signal to a predetermined IF frequency.

To comply with the FCC all-channel requirements, a continuous type tuner which converts a selected UHF signal to an IF signal in the 40 mc. region can be employed. One position on the VHF turret can then be reserved for a strip having frequency selectors which are tuned to 40 mc. When coupled in operating relation with the UHF and VHF tuners simultaneously, this strip serves to condition the amplifier and oscillator-mixer tubes of the VHF tuner as amplifying devices for converted UHF signals. In this fashion, remote control selection of a predetermined number of VHF-UHF channels can be achieved while still meeting the all-channel requirement.

Possibly the most obvious shortcoming in a system of the type outlined is the cost. For example, prior art UHF strips are costly because each strip carries circuitry and components which, for all practical purposes, are duplicated in all the other UHF strips. Another shortcoming of prior art UHF strips is their larger physical size, in comparison to VHF strips, which precludes a direct one-for-one substitution for VHF strips.

Another consideration of practical importance is the facility with which existing VHF turret tuners can be modified to accommodate UHF tuning strips. Field conversion of a VHF turret to accommodate UHF channels must not only be inexpensive from the component standpoint, but it must not entail any significant reworking of the existing tuner.

It is, therefore, a principal object of the invention to provide a VHF turret-type tuner having an UHF tuning apparatus which permits full utilization of the turret's channel accommodations with VHF and/or UHF tuning strips.

It is another principal object of the invention to provide an improved all-channel VHF–UHF television tuner capable of accommodating a remote control facility.

It is another object of the invention to provide an improved UHF tuning apparatus for use in a turret-type tuner.

It is a further object of the invention to provide UHF tuning apparatus readily adaptable to pre-existing VHF tuners.

It is also an object of the invention to provide an improved UHF tuning strip characterized by an economical as well as a compact construction.

A television turrent tuner constructed in accordance with the television comprises a rotatable carriage having provision for accommodating an arry of tuning strips which are individually assigned to predetermined television channels. The tuner includes a stationary chassis comprising a pair of concentric stationary contact assemblies, one inboard and one outboard of the array of tuning strips. All the active circuit elements of the tuner are mounted on the chassis and connected in a circuit having access points coupled to the stationary contact assemblies. Each tuning strip is individually provided with passive frequency determining elements and at least one of the strips has two sets of contacts respectfully adapted to engage the stationary contact assemblies to complete the tuner circuit when that strip is presented to a predetermined index station.

In a preferred embodiment of the invention, a tuning apparatus for a television receiver capable of responding to any channel in the VHF–UHF television spectrum and adaptable to remote control selection of anyone of a predetermined number of television channels, including an intermixture of VHF and UHF channels in any desired combination, comprises a continuous-type frequency selector responsive to wave signals in the UHF band and including means for converting such wave signals to a predetermined IF signal. This tuning apparatus also includes at least one VHF tuning strip having frequency selector means responsive to an assigned VHF channel, at least one UHF tuning strip comprising tuned interstage circuit means, a preselector including the antenna input circuit tuned to a discrete UHF frequency and means for providing a heterodyning signal. Also included is a tuning strip having circuit means responsive to the converted UHF signal. Each of the aforesaid strips is provided with a series of contacts. There is also provided a rotatable carriage having provisions for mounting a predetermined number of tuning strips. Additionally, a stator assembly comprising a bank of switch contacts, which define an index station, includes signal translating circuitry connected to the switch contacts and tuned by the strip which occupies the index station so as to condition the television receiver for operation at the channel frequency assigned the indexed strip. An UHF frequency conversion adaptor comprising input and output terminals and a non-linear device is provided with means for mounting it adjacent the stator. Finally, drive means responsive to a remote control signal actuate the carriage so as to position a desired tuning strip in regis-stration with the stator. As a result, the contacts of a selected VHF tuning strip engage the stator contacts when the VHF strip occupies the index station while the UHF channel, to which the continuous type frequency selector is instantaneously responsive, is selected when the contacts of the IF strip engage the stator contacts. Finally, operation at a discrete UHF frequency obtains when a selected UHF strip occupies the index station. In this instance assigned contacts of a selected UHF strip engage the adaptor input and output terminals to develop an IF signal while, simultaneously, other of the UHF strip contacts engage the stator contacts.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

FIGURE 1 is a perspective view, partly in section, of a VHF-UHF television tuner arrangement constructed in accordance with the invention;

FIGURE 3 is a perspective view of a UHF adaptor for the tuner arrangement of FIGURE 1;

Figures 2, 5, 6, 7:
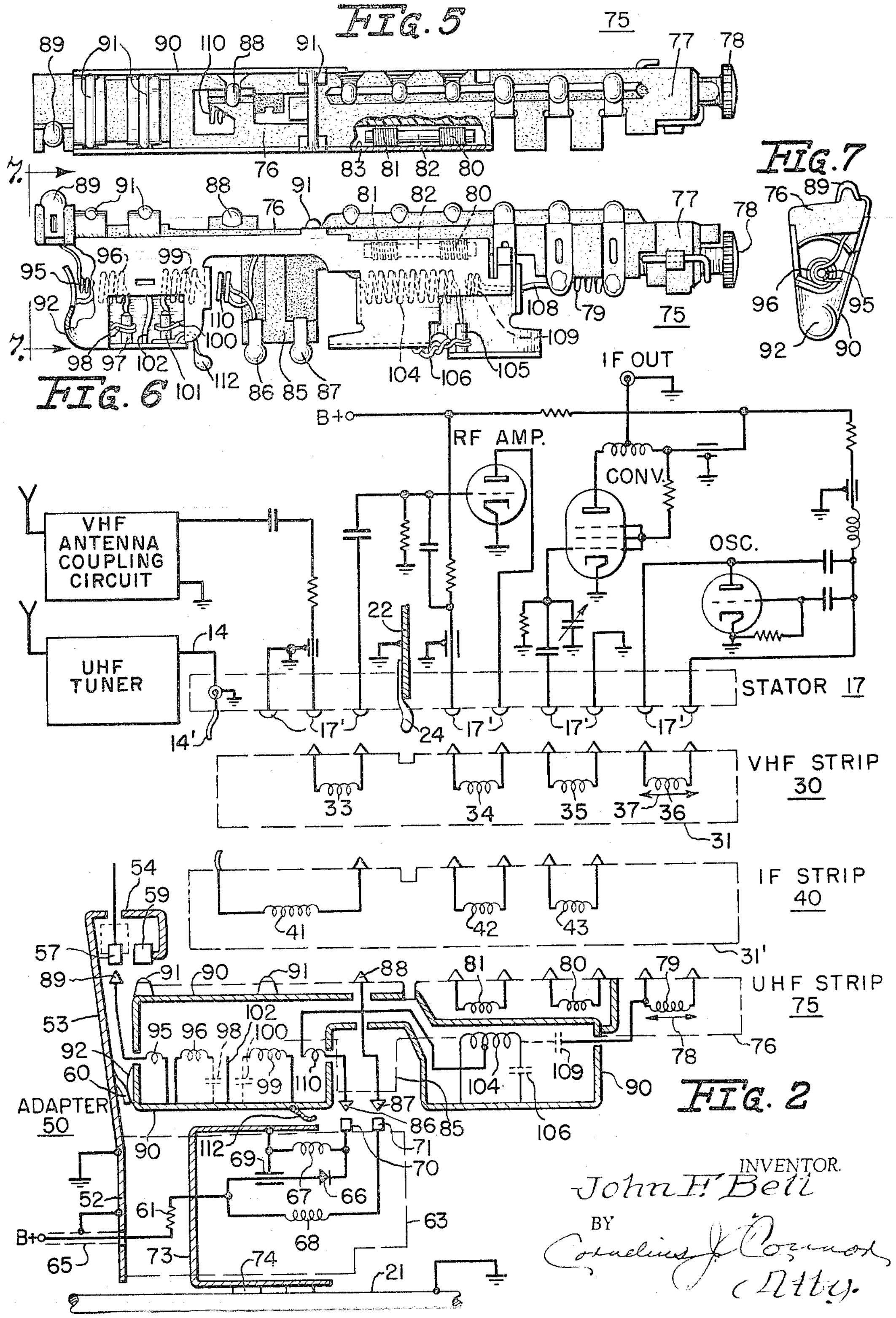
FIGURE 2 is a schematic circuit diagram of the tuner arrangement shown in FIGURE 1.

FIGURE 3*a* is a sectional view of the UHF adaptor taken along lines 3*a*—3*a* in FIGURE 3;

FIGURE 3*b* is a sectional view of the UHF adaptor taken along lines 3*b*—3*b* in FIGURE 3;

FIGURE 4 is another sectional view of the UHF adaptor, taken along lines 4—4 in FIGURE 1;

FIGURE 5 is a top view of an UHF tuning strip for use in the tuner arrangement of FIGURE 1;

FIGURE 6 is a side view of the UHF tuning strip shown in FIGURE 5; and

FIGURE 7 is an end view of the UHF tuning strip taken along lines 7—7 in FIGURE 6.

The television tuning apparatus 10 shown in FIGURE 1 comprises an UHF tuner 11 and a turret-type VHF tuner 12. Preferably, the former constitutes a device of known construction, e.g., a series of transmission lines which are continuously tunable across the UHF band by the control 13. Tuner 11 includes, in addition to an RF preselector and an oscillator, a mixer stage for converting the selected signal to a predetermined (40 mc.) IF frequency. The IF output signal from UHF tuner 11 is coupled via a cable 14 to VHF tuner 12 which, during UHF operation and in a manner to be more fully explained below, serves as an amplifier for converted UHF signals.

Tuning apparatus 10 is capable not only of responding to any channel in the VHF–UHF television spectrum, but also readily accommodates remote control apparatus for selecting any one of a predetermined number of television channels. As will be shown, the selection can include an intermixture of VHF and UHF channels in any desired combination totaling this number. For this purpose VHF tuner 12 is actuated by a control apparatus 15, which is responsive to a remotely generated control signal, and preferably constitutes a motor-driven geneva movement of the type disclosed by Eugene J. Polley in Patent 3,070,736 which issued December 25, 1962, and is assigned to the same assignee as the present invention.

It will be appreciated, of course, that the television receiver (not shown) is conditioned for operation at a desired channel by tunable signal translating circuitry. To this end VHF tuner 12 comprises an input circuit, an RF amplifier, a local oscillator, and a first detector or heterodyne stage in which the amplified radio frequency signal is converted to an intermediate frequency signal which drives the video and audio circuits of the receiver proper, all in conventional fashion. The active circuit elements of tuner 12 are supported by the tuner housing or chassis and are connected in a circuit having access points coupled to stationary contact assemblies which are described below. This circuitry is schematically illustrated in FIGURE 2. A stator assembly 17 comprising a bank of depressable ribbon-type switch contacts 17' terminates these tunable circuits and defines an index station for the tuner carriage or turret, details of which are discussed below. Stator 17 also includes an IF input contact 14' which is connected to cable 14 from UHF tuner 11.

Referring again to FIGURE 1, the principal structure there illustrated is VHF tuner 12 which comprises a housing 18 having a pair of end walls 19, 20 that rotatably support a control shaft 21. A turrent or carriage is defined by a pair of axially aligned discs 22, 23 which are fixed to and rotatable with control shaft 21. An extension of shaft 21 protrudes beyond end wall 19 and is mechanically coupled to control apparatus 15. If desired the opposite end of shaft 21 may be fitted with a manual control knob 16. Discs 22, 23 include provisions for supporting a plurality of tuning strips in a circular array about shaft 21. In an actual embodiment discs 22, 23 have provisions for supporting thirteen tuning strips. However, in order to avoid cluttering the drawing, only one of each type tuning strip to be considered is shown. Insofar as mounting provisions are concerned, disc 22 may conveniently take the form of a spider constructed of a like plurality of resilient radially extending tines 24 with one such tine captivating and supporting one portion of an assigned tuning strip. Tines 24 also serve to ground disc 22 to tuner housing 18 through a resilient metal clip 25 which is secured to the housing. Disc 23, on the other hand, is provided with a plurality of apertures 26 complementary in configuration to that end of the tuning strip which is received and supported therein. In a manner conventional in turrent tuner construction, the peripheral edge of disc 23 is scalloped to provide a series of indentations which cooperate with a detent roller 28 to afford positive indexing of the turrent assembly.

Among the strips shown in FIGURE 1 is a representative VHF tuning strip 30 comprising a panel 31 of insulating material, preferably formed of a glass filled thermosetting plastic marketed under the name Glaskyd. Panel 31 has a slot near one end for receiving one of tines 24 and a shoulder 32 at the opposite extremity which is receivable within one of the apertures 26 of disc 23. Each VHF strip is individualized insofar as its frequency selectors are concerned to the end that each such strip conditions the tuner for operation at an assigned VHF channel. Conventionally, the selectors take the form of a series of inductance coils 33–36 terminated, respectively, by contact pairs which are affixed to panel 31 and present contact surfaces to stator switch contacts 17'. Reference is made to the schematic diagram of FIGURE 2 wherein the constituents of strip 30, as well as their manner of cooperation with tuner 12, are best illustrated.

Disposed within shoulder 32 is a rotatably supported tuning slug 37 which is deplaceable with respect to coil 36 for tuning the local oscillator. A fine tuning control mechanism 38, having a viewer-actuated control knob 39 coaxially fitted with respect to knob 16 and shaft 21, mechanically engages slug 37 upon rotation of knob 39. Mechanism 38 can be an arrangement of the type described in copending application Serial No. 89,570 filed on February 15, 1961, in the name of Otto H. Schwartz and issued on August 11, 1964, as Patent 3,144,626 and assigned to the same assignee as the present invention.

Tuner 12 also includes an IF strip 40 having frequency determining coils 41–43 also terminated by respective contact pairs. Except for the fact that one of the contacts for coil 41 is positioned at the extremity of strip 40 for presentation to UHF input contact 14' thus necessitating a slightly longer panel 31', for all practical purposes the panel and mounting provisions for this strip are the same as their counterparts in VHF strip 30. Coils 41–43 are presentable to the input and output of the RF amplifier and to the converter, respectively, thru stator contacts 14', 17' for conditioning VHF tuner 12 to function as an amplifier for IF output signals from UHF tuner 11, see FIGURE 2.

Before discussing a representative UHF tuning strip, consideration will first be given to an UHF adaptor 50 which enables VHF tuner 12 to accommodate UHF strips. As best seen in FIGURE 1 adaptor 50 constitutes, in effect, a second stator assembly which is disposed in concentric relation to stator 17. In this dual-stator arrangement the auxiliary stator 50 is positioned inboard of the array of tuning strips while the main contact assembly is outboard relative to the strips. More particularly, and with reference to FIGURES 3–4 adaptor 50 includes a mounting bracket comprising a sheet of resilient conductive metal, preferably spring stock, having a base portion 52 and an extension 53 thereof which is permanently canted with respect to the base. Extension 53 includes a ledge 54 that supports a spring clip 55 terminated by a lug 56 which is receivable in an indexing slot 51, see FIGURE 4, in the top wall of tuner housing 18. Ledge 54 also carries an insulator block to which is affixed a resilient antenna input terminal 57 which is connected to an impedance transformer or balun 58 which, in turn, is connected to an UHF antenna (not shown). A ribbon-type grounding contact 59 is fitted to the underside of ledge 54, while a spring leaf grounding contact 60 is affixed to wall 53 of the mounting bracket.

Secured to base 52 of the bracket by a set of clips 62 and disposed substantially normal to the base is a support form 63 of insulating material, preferably of unitary Glaskyd construction. The outer surface of form 63 is channeled in several areas to provide storage for circuit components while its center is relieved to form a bore 64 for receiving turret shaft 21. Disposed within channels in form 63 are a biasing resistor 61, a mixer crystal 66, a contact-resonating coil 67, an IF coil 68, and a feed-through type capacitor 69. Form 63 also supports a pair of terminals 70, 71 which are connected to mixer crystal 66 and IF coil 68, respectively. Crystal 66, the center electrode of capacitor 69 and IF coil 68 are connected in a series relation. Resistor 61 returns the junction of capacitor 69 and coil 68 to a source of positive potential B+, via a shielded conductor 65, which biases crystal 66 to a desired operating point. Coil 67 is connected between terminal 70 and a plane of reference potential in order to resonate the distributed capacity-to-ground of contact 70. Otherwise this capacitance would shunt a low impedance path to ground across mixer crystal 66. The aforementioned reference plane is established by a conductive semicylindrical member 73, having folded back finger portions 74, which is mounted upon form 63 in such a fashion as to shield crystal 66 and coil 67 and to effect a positive connection with the outer terminal of feed-through capacitor 69. Shield fingers 74 are disposed within bore 64 and in conductive engagement with control shaft 21, to establish a wiping contact with turret shaft 21 when the adaptor is mounted on the shaft as may best be seen in FIGURE 3*b*.

A representative UHF strip 75 is shown in registration with stator 17 and adapter 50 in FIGURE 1, however, its construction is more readily understood by reference to FIGURES 5–7 and to the schematic circuit diagram of FIGURE 2. As depicted in FIGURES 5–7, strip 75 comprises an elongated panel 76 of insulating material having a slot to accommodate mounting tine 24 and terminated by a shoulder 77 similar to its counterpart in VHF strip 30. While panel 76 is slightly longer than the panels for strips 30 and 40, its width is the same thus permitting free substitution of strips. A tuning slug 78 is rotatably supported within shoulder 77 for introduction to a frequency-determining coil 79 terminated by a contact pair on the top or outside surface of panel 76 as viewed in FIGURE 6. As will be shown, coil 79 serves as a heterodyning signal source for UHF strip 75. Strip 75 further includes a pair of coils 80, 81 likewise having associated contact pairs on the outside surface of panel 76 and wound upon a core 82 which is disposed within a well 83 in panel 76. Coils 80, 81 are tuned to the IF frequency of the VHF tuner and are connectable through appropriate stator contacts 17' to the RF amplifier output and the converter input of the tuner for the purpose of converting the tuner to an amplifier when UHF strip 75 is indexed with stator 17. Panel 76 includes a pedestal 85 which presents a pair of contacts 86, 87 at the bottom or inside surface of panel 76. A contact 88, affixed to the opposite side of panel 76, is directly connected to contact 87. Accordingly, by virtue of this construction, panel 76 presents, when mounted upon turret discs 22, 23, considered radially, inner and outer sets of contacts. Panel 76 also includes an antenna input contact 89 which is located at its left extremity, as viewed in FIGURES 5 and 6.

Affixed to panel 76 is a compartmentalized wedge-shaped metal chassis 90 having top, bottom and side walls, see FIGURE 7, for housing and shielding the UHF components of the strip. Chassis 90 also serves to shield IF coils 80, 81 from the UHF circuitry and is secured to panel 76 by a plurality of straps 91 which also serve as grounding terminals. An abutment 92, which terminates one end of chassis 90, constitutes an additional grounding terminal.

Commencing at the left end of the strip, as viewed in FIGURE 6, chassis 90 includes a preselector compartment comprising an antenna loop 95 which is connected between antenna input contact 89 and chassis 90. An antenna coil 96, in coaxial alignment with loop 95, has one end grounded to the chassis 90 and the other end supported by a dielectric post 97. A loop of wire 98 encircling post 97 and positionable there along constitutes, in conjunction with the adjacent ungrounded terminal of coil 96, an adjustable capacitor for tuning coil 96 to a particular UHF channel. This arrangement is shown schematically by broken-line construction in FIGURE 2.

The preselector includes a second tuned RF section comprising the coil 99 which also has one terminal returned to chassis 90 and an adjustable loop type capacitor electrode 100 similar to loop 98 and encircling a post 101 of dielectric material which supports the other terminal of coil 99. The coupling between tuned circuits 96–98 and 99–101 is largely capacitive and since the band pass characteristic of the strip is dependent upon the coupling therebetween, a capacitive shield 102 is interposed between the ungrounded terminals of coils 96, 99 to facilitate adjustment of their pass band. Structurally shield 102 is in the form of a hook-shaped wire conductor which is grounded to the chassis wall and is fabricated of flexible stock in order that it may be easily positioned to control the inter-coil capacitance.

The heterodyning signal source is located in the right hand compartment of chassis 90, as viewed in FIGURE 6, and includes coil 79 which adjusts the frequency of the VHF local oscillator to a suitable subharmonic of the required UHF heterodyning signal frequency. The desired multiplied frequency or harmonic for heterodyning the received UHF signal is selected by a multiplier coil 104 having a grounded terminal and one supported by a dielectric post 105. Coil 104 is tuned by an adjustable loop 106 which encircles post 105. The construction of coil 104 and that of its tuning device 106 are substantially the same as coil 96 and capacitor device 98 described for the preselector section. Multiplier circuit 104–106 is coupled to coil 79 by an injection circuit comprising a length of conductor 108 having one end directly connected to coil 79 and a free end looped to form, in effect, a capacitor electrode 109 which is positioned adjacent coil 104.

Depending upon the harmonic content of the VHF oscillator it may be desirable to augment harmonic production by including a multiplier crystal arrangement in the injection circuit. This circuit may be of the type disclosed in copending application Serial Number 137,577 which was filed September 12, 1961 in the name of John F. Bell and issued on October 27, 1964 as Patent 3,154,742 and which is assigned to the same assignee as the present invention.

Finally, mixer circuit means are coupled between preselector coil 99 and multiplier coil 104 for deriving an intermediate frequency signal. To this end a mixer loop 110, disposed in inductive proximity to coil 99, has one terminal connected to a tap on multiplier coil 104 and the other terminal connected to contact 86 on pedestal 85. A resilient conductive tab 112, extending from the underside of chassis 90 for presentation to adapter shield 73, affords a ground connection for the mixer circuit.

In a tuning apparatus of the type herein considered, it will be assumed, of course, that the frequency determining components of the VHF, the IF and the UHF strips are factory pretuned to be selective to assigned frequencies. In a factory assembly and prior to inserting any strips in the tuner, the UHF adapter 50 is mounted upon turret shaft 21. This is accomplished by seating form 63 upon turret shaft 21, with shield fingers 74 in wiping engagement with shaft 21, then compressing spring clip 55 and rotating the adapter about the shaft inwardly with clip 55 bearing against the underside of the top wall of housing 18. Adapter 50 is properly mounted and indexed when tab 56 of clip 55 enters indexing slot 51 in the upper wall of housing 18 as seen in FIGURE 4. The compressive force stored in clip 55 exerts a downward pressure upon form 63 through bracket walls 52, 53 so as to firmly seat form 63 upon turret shaft 21. Moreover, when so mounted, the canted walls 52, 53 of the bracket itself are constituted a spring. This obtains by virtue of the fact that the pressure exerted by spring clip 55 tends to straighten wall 53 with respect to wall 52. As a result a restoring force is set up in the walls which attempts to return them to their original positions. This restoring force is transmitted to form 63 to urge it, not only toward shaft 21, but also against turret disc 22 to insure positive seating of adapter 50.

In a field conversion, of course, a sufficient number of strips must be temporarily removed in order to permit insertion of adapter 50. Thereafter, and this step will also be a field job in substantially all instances since VHF tuners are always shipped from the factory with a full complement of VHF strips, tuning strips for local UHF stations are then substituted for any VHF strips not required for the particular locale. Of course, IF strip 40 is retained in order to accommodate UHF tuner 11.

Having now the desired combination of VHF and UHF discrete frequency selectors mounted upon the VHF turret, attention is directed to the mechanics of channel selection. Operation at a particular VHF channel, for example, is initiated by rotating the turret, either manually by control knob 16 or by actuating remote control mechanism 15, until VHF tuning strip 30 occupies the index station defined by stator 17.

This operation places the paired contacts for coils 33–36 in conductive engagement with paired ones of stator contacts 17′ so that the coils are electrically connected to the signal translating circuitry of the VHF tuner. Thus, a desired signal intercepted by the VHF antenna is coupled to the input section of the RF amplifier through coil 33 which coil, in conjunction with the input capacity of the amplifier tube, selectively tunes the grid circuit of the amplifier to the assigned channel. An amplified replica of the desired signal is developed across coil 34 in the output circuit of the amplifier and is inductively coupled to the input of the converter tube via coil 35. Simultaneously, oscillator energy from coil 36 is coupled to converter grid coil 35. The converter tube then performs a conventional mixing function to develop a signal of intermediate frequency across the IF coil in its anode circuit. The IF signal is coupled to the IF amplifiers from whence it is translated to other stages of the television receiver proper for developing the necessary video and sound information signals to operate the receiver.

To utilize UHF tuner 11, the turret shaft is rotated until strip 40 is in registration with stator 17. The UHF tuner is then manually tuned by control 13 until a desired channel has been selected. The operation of this tuner is as follows. Tuner 11 upon selecting a particular UHF channel simultaneously performs a heterodyning function to develop an IF signal which is coupled to stator contact 14′ through cable 14. This IF signal is then coupled to the input of the RF amplifier through coil 41. Since IF strip 40 does not present a tuning inductance to the VHF oscillator plate circuit, that oscillator is disabled and coils 42 and 43,, respectively, tune the output of the RF amplifier and the input of the converter tube so that both tubes operate as "straight-through" IF amplifiers. The output of the tuner is then fed to the receiver proper.

If the UHF tuner remains permanently tuned to a particular UHF station, it can serve as a discrete UHF channel selector since each time IF strip 40 is indexed with stator 17, the television receiver will operate on the pre-tuned UHF channel.

Operation at discrete UHF frequencies is had by stepping the turret, again either manually or by remote control actuation, until the desired UHF tuning strip is simultaneously in registration with stator 17 and adapter 50. In this position the paired contacts for coils 79–81 are connected to the VHF oscillator, the converter input and the RF amplifier output, respectively, of the VHF tuner. Since coils 80, 81 are tuned to an IF in the 40 mc. region and oscillator coil 79 is tuned to a fundamental in the 200 mc. region, for all practical purposes no signal energy is coupled from coil 79 to the VHF converter tube thus enabling the RF and converter stages of the VHF tuner to function as IF amplifiers. UHF strip contact 88 is connected to the input of the RF amplifier thru a stator contact while the adjacent ground strap 91 is returned to reference potential via a stator contact 17′. The other strip 91 is grounded through ribbon contact 59 and brackets 52, 53. The abutment 92 of chassis 90 is grounded to the bracket through leaf contact 60 while tab 112 serves to ground chassis 90 to turret shaft 21 through shield 73.

The significance of these multiple ground connections resides in the fact that, at UHF frequencies, it is extremely important to short-circuit ground currents which may be common to two or more circuits. At UHF frequencies even a relatively short conductive path constitutes an impedance of significant magnitude. A voltage developed across this impedance can, if coupled to the antenna circuit, result in undesired radiation.

The UHF signal is coupled from balun 58 and through contacts 57, 89 to antenna loop 95 and thence to the preselector tuned circuits 96–98 and 99–101 which have been pretuned at the factory to select a particular UHF channel. Simultaneously, a heterodyning signal frequency-spaced from the selected UHF channel by approximately 40 mc. is derived by multiplier circuit 104, 106. Since mixer coil 110 is inductively coupled to preselector coil 99 and conductively connected to multiplier coil 104, the selected UHF signal and the heterodyne signal are concurrently applied to mixer crystal 66 through strip contact 86 and adaptor terminal 70. The feed-through capacitor 69 constitutes an A.C. ground return for the UHF and heterodyne signals. Mixer 66 develops an IF of predetermined frequency across coil 68 which signal appears at terminal 71 on adapter 50 and is then coupled via strip contacts 87, 88 to the grid of the VHF tuner amplifier. The VHF tuner, which has already been conditioned to function as an IF amplifier by coils 80, 81 then translates the IF signal to the television receiver proper.

The disclosed tuning apparatus has a number of distinctive advantages. As shown, it fully complies with FCC regulations requiring all-channel tuning. At the same time it readily permits modification of the VHF tuner to accommodate a predetermined number of VHF and UHF channels for a remote control operation. Moreover, the particular structure for accommodating strips i.e., adapter 50, is of such as to admit of ready field installation. Furthermore, in achieving these objectives, only one mixer crystal 66 and one IF coil 68 are required, regardless of the number of UHF tuning strips. In conclusion the particular construction of the mixer support form 63 and its shield 73 reduces not only radiation of IF signals from the mixer circuit but also prevents interference signals in the IF region from being coupled to the tuner input.

While a particular embodiment of the present invention has been shown and described, it is apparent that changes and modifications may be made therein without departing from the invention in its broader aspects. The aim of the appended claims, therefore, is to cover all such changes and modifications as fall within the true spirit and scope of the invention.

I claim:

1. A tuning apparatus for a television receiver capable of responding to any channel in the VHF–UHF television spectrum and adaptable to remote control selection of any one of a predetermined number of television channels, including an intermixture of VHF and UHF channels in any desired combination totaling said predetermined number, comprising:

a continuous-type frequency selector responsive to wave signals in the UHF band and including means for converting said wave signals to a predetermined IF signal;

a tuning strip having circuit means responsive to said IF signal;

at least one VHF tuning strip having frequency selector means responsive to an assigned VHF channel;

at least one UHF tuning strip comprising tuned interstage circuit means, a preselector including an antenna input circuit tuned to a discrete UHF frequency and means for providing a heterodyning signal, each of said strips having a series of contacts;

a rotatable carriage having provisions for supporting a predetermined number of said tuning strips, a stator assembly comprising a bank of switch contacts defining an index station and signal translating circuitry connected to said switch contacts and tunable by a strip occupying said index station for conditioning said television receiver for operation at a channel frequency determined by said indexed strip;

an UHF frequency conversion adaptor comprising input and output terminals and a non-linear device;

means for mounting said adaptor adjacent said stator;

and drive means responsive to a remote control signal for actuating said carriage so as to position a desired tuning strip in registration with said stator, the contacts of a selected VHF tuning strip engaging said stator contacts for VHF operation when said VHF strip occupies said index station, the contacts of said IF strip engaging said stator contacts to select the UHF channel to which said continuous-type frequency selector is instantaneously responsive when said IF strip occupies said index station, while assigned contacts of a selected UHF strip engage said adaptor input and output terminals to develop an IF signal and, simultaneously, other of said UHF strip contacts engage said stator contacts for operation at a discrete UHF frequency when said UHF strip occupies said index station.

2. In a turret-type VHF tuner having a displaceable carriage with a control shaft and a stator assembly comprising signal translating circuitry having a bank of switch contacts connected thereto and defining an index station, an UHF frequency selector comprising:

a tuning strip having provisions for mounting said strip upon said carriage and comprising a plurality of contacts, interstage circuit means tuned to a predetermined IF frequency, and a preselector including an input circuit tuned to a discrete UHF frequency and means for providing a heterodyning signal;

a frequency conversion adaptor comprising input and output terminals, an antenna coupler, and a non-linear device;

and means for fixedly mounting said adaptor in relation to said stator assembly in an overlying relation to said control shaft and maintaining an electrical grounding connection with said shaft, said strip being displaceable to said index station upon displacement of said carriage whereby said means for providing a heterodyning signal is energized and assigned ones of said strip contacts engage said antenna coupler and said adaptor input terminals to couple said preselector to said antenna coupler and to said non-linear device to develop an IF signal of said terminals while others of said strip contacts simultaneously engage said stator contacts to couple said strip interstage circuit means to said signal translating circuitry to condition said tuner as an IF amplifier during reception of UHF frequencies.

3. In a turret-type VHF tuner having a rotatable carriage with a control shaft and a stator assembly comprising signal translating circuitry having a bank of switch contacts connected thereto and defining an index station, an UHF frequency selector comprising:

a tuning strip having provisions for mounting said strip upon said carriage and comprising a plurality of contacts, interstage circuit means tuned to a predetermined IF frequency, and a preselector including an input circuit tuned to a discrete UHF frequency and means for providing a heterodyning signal;

a frequency conversion adaptor comprising input and output terminals, an antenna coupler, and a mixer crystal;

and means for fixedly mounting said adaptor in relation to said stator assembly in an overlying relation to said control shaft and maintaining an electrical grounding connection with said shaft, said strip being displaceable to said index station upon rotation of said carriage whereby said means for providing a heterodyning signal is energized and assigned ones of said strip contacts engage said antenna coupler and said adaptor input terminals to couple said preselector to said antenna coupler and to said mixer crystal to develop an IF signal of said predetermined frequency at said adaptor output terminals while others of said strip contacts simultaneously engage said stator contacts to couple said strip interstage circuit means to said signal translating circuitry to condition said tuner as an IF amplifier during reception of UHF frequencies.

4. In a turret-type VHF tuner having a rotatable carriage with a control shaft and a stator assembly comprising signal translating circuitry having a bank of switch contacts connected thereto and defining an index station, an UHF frequency selector comprising:

a tuning strip having provisions for mounting said strip upon said carriage and comprising a plurality of contacts, interstage circuit means tuned to a predetermined IF frequency, and a preselector including an input circuit tuned to a discrete UHF frequency and means for providing heterodyning signal;

a frequency conversion adaptor comprising input and output terminals, an antenna coupler, a mixer crystal and a shield member overlying said crystal;

and means for fixedly mounting said adaptor in relation to said stator assembly in an overlying relation to said control shaft and maintaining an electrical grounding connection between said shield member and said shaft, said strip being displaceable to said index station upon rotation of said carriage whereby said means for providing a heterodyning signal is energized and assigned ones of said strip contacts engage said antenna coupler and said adaptor input terminals to couple said preselector to said antenna coupler and to said mixer crystal to develop an IF signal of said predetermined frequency at said adaptor output terminals while others of said strip contacts simultaneously engage said stator contacts to couple said strip interstage circuit means to said signal translating circuitry to condition said tuner as an IF amplifier during reception of UHF frequencies.

5. In a television receiver, a turret-type tuner for utilizing wave signals in the UHF band comprising:

a tuning strip comprising a plurality of contacts, interstage circuit means tuned to a predetermined IF frequency, and a preselector including an antenna input circuit tuned to an assigned UHF frequency and means for providing a heterodyning signal;

a stator assembly comprising a bank of switch contacts defining an index station and signal translating circuitry coupled to said switch contacts and tunable by said interstage circuit means for conditioning said tuner for operation as an amplifier;

a frequency conversion adaptor comprising input and output terminals and a non-linear device;

means for fixedly mounting said adaptor relative to said stator;

and carriage means for supporting said tuning strip and responsive to actuation for advancing said strip to said index station to effect engagement between assigned ones of said strip contacts and said adaptor input and output terminals to develop an IF signal and simultaneously, to effect engagement between other of said strip contacts and said stator contacts to condition said tuner as an IF amplifier during reception of UHF frequencies.

6. In a television receiver, a turret-type tuner for utilizing wave signals in the UHF band comprising:

a tuning strip comprising a plurality of contacts, interstage circuit means tuned to a predetermined IF frequency, and a preselector including an antenna input circuit tuned to an assigned UHF frequency and means for providing a heterodyning signal;

a stator assembly comprising a bank of switch contacts defining an index station and signal translating circuitry coupled to said switch contacts and tunable by said interstage circuit means for conditioning said tuner for operation as an amplifier;

a frequency conversion adaptor comprising a mixer circuit including an input terminal, a non-linear device, a frequency-determining impedance and an output terminal;

means for fixedly mounting said adaptor relative to said stator;

and carriage means for supporting said tuning strip and responsive to actuation for advancing said strip to said index station to effect engagement between assigned ones of said strip contacts and said mixer circuit input and output terminals to develop an IF signal across said frequency-determining impedance and simultaneously, to effect engagement between other of said strip contacts and said stator contacts to condition said tuner as an IF amplifier during reception of UHF frequencies.

7. In a televison receiver, a turret-type tuner for utilizing wave signals in the UHF band comprising:

a tuning strip comprising a plurality of contacts, interstage circuit means tuned to a predetermined IF frequency, and a preselector including an antenna input circuit tuned to an assigned UHF frequency and means for providing a heterodyning signal;

a stator assembly comprising a bank of switch contacts defining an index station and signal translating circuitry coupled to said switch contacts and tunable by said interstage circuit means for conditioning said tuner for operation as an amplifier;

a frequency conversion adaptor comprising a mixer circuit having an input terminal, a mixer crystal, an IF coil and an output terminal;

means for fixedly mounting said adaptor relative to said stator;

and carriage means for supporting said tuning strip and responsive to actuation for advancing said strip to said index station to effect engagement between assigned ones of said strip contacts and said mixer circuit input and output terminals to develop an IF signal across said IF coil and simultaneously, to effect engagement between other of said strip contacts and said stator contacts to condition said tuner as an IF amplifier during reception of UHF frequencies.

8. A tuning strip for use in a television turret tuner having a rotatable carriage comprising:

an elongated support strip of insulating material having radially outer and inner exposed contact areas when inserted in said rotatable carriage;

a plurality of passive frequency-determining circuit elements mounted on said strip;

and a plurality of outwardly directed switching contacts connected to said circuit elements and disposed at predetermined locations of said outer and inner contact areas.

9. A tuning strip for use in a television turret tuner having a rotatable carriage comprising:

an elongated support strip of insulating material having radially outer and inner exposed contact areas when inserted in said rotatable carriage;

a plurality of passive frequency-determining circuit elements mounted on said strip;

a plurality of outwardly directed switching contacts connected to said circuit elements and disposed at predetermined locations of said outer and inner contact areas;

and a pair of interconnected additional contacts disposed at other predetermined locations of said outer and inner contact areas respectively.

10. A television turret tuner comprising:

a rotatable carriage having provisions for accommodating an array of tuning strips individually assigned to a predetermined television channel;

and a stationary tuner chassis comprising a plurality of active circuit elements and a pair of concentric stationary contact assemblies, one inboard and one outboard of said array of tuning strips;

all of said active circuit elements being mounted on said chassis and connected in a circuit having access points coupled to said stationary contact assemblies, said tuning strips individually being provided with passive frequency-determining circuit elements and at least one of said strips having two sets of contacts respectively adapted to engage said stationary contact assemblies to complete said tuner circuit when said one strip is presented to a predetermined index station.

11. A television turret tuner comprising:
a rotatable carriage having substantially identical provisions for accommodating an array of physically interchangeable VHF and UHF tuning strips individually assigned to a predetermined television channel;
and a stationary tuner chassis comprising a plurality of active circuit elements and a pair of concentric stationary contact assemblies, one inboard and one outboard of said array of tuning strips;
said tuning strips individually being provided with passive frequency-determining circuit elements terminated by a set of contacts adapted to engage said outboard stationary contact assembly when said strips are presented seriatim to a predetermined index station,
said UHF tuning strip including an additional set of contacts adapted to engage said inboard stationary contact assembly when said carriage is adjusted to present said UHF strip to said index station,
and all of said active circuit elements being mounted on said chassis and connected to said stationary contact assemblies.

12. A television tuner comprising:
a rotatable carriage;
a first stationary contact assembly comprising signal translating circuitry;
a second stationary contact assembly positioned in a concentric relation to said first contact assembly and including a mixer circuit;

a tuning strip comprising an elongated panel of insulating material demountably supported upon said carriage for passage between said stationary contact assemblies upon rotation of said carriage and having first and second series of contacts respectively supported on oppositely disposed surfaces of said strip,
a plurality of frequency-determining circuits mounted on said panel for tuning selected ones of said signal translating circuits and terminated by assigned ones of said first series of contacts,
circuit means, including means for providing a heterodyning signal, mounted on said panel and terminated by said second series of contacts,
said frequency-determining circuits and said circuit means being simultaneously coupled to said signal translating circuitry and said mixer stage, respectively, upon rotation of said carriage placing said first and second series of contacts in registration with said first and second stationary contact assemblies, repectively.

References Cited by the Examiner

UNITED STATES PATENTS 2,785,297 3/1957 Scandurra ---------- 325—461

KATHLEEN H. CLAFFY, *Primary Examiner.*

R. LINN, *Assistant Examiner.*